(12) United States Patent
Shimizu et al.

(10) Patent No.: US 6,383,900 B1
(45) Date of Patent: May 7, 2002

(54) METHOD AND APPARATUS FOR FORMING POLYCRYSTAL SILICON FILM

(75) Inventors: Akira Shimizu; Kunitoshi Nanba, both of Tama; Atsuki Fukazawa, Chino, all of (JP)

(73) Assignee: ASM Japan K.K., Tokyo (JP)

( * ) Notice: Subject to any disclaimer, the term of this patent is extended or adjusted under 35 U.S.C. 154(b) by 0 days.

(21) Appl. No.: 09/591,589

(22) Filed: Jun. 9, 2000

(30) Foreign Application Priority Data

Jun. 18, 1999 (JP) .......................................... 11-172092

(51) Int. Cl.$^7$ ........................... H01L 21/20; H01L 21/36
(52) U.S. Cl. ....................... 438/488; 438/255; 438/398; 438/489; 438/665; 438/795; 438/964
(58) Field of Search ................................. 438/488, 255, 438/398, 964, 96, 381, 795, 665, 386, 246, 389, 239, 253, 482, 486, 489, 481, 478

(56) References Cited

U.S. PATENT DOCUMENTS

| | | | |
|---|---|---|---|
| 5,639,689 A | * | 6/1997 | Zahurak et al. ............. 438/658 |
| 5,650,351 A | | 7/1997 | Wu |
| 5,723,384 A | | 3/1998 | Park et al. |
| 5,837,580 A | | 11/1998 | Thakur et al. |
| 5,926,711 A | | 7/1999 | Woo et al. |
| 6,027,970 A | | 2/2000 | Sharan et al. |
| 6,066,529 A | | 5/2000 | Lin et al. |
| 6,127,221 A | | 10/2000 | Lin et al. |
| 6,143,619 A | | 11/2000 | Okamura et al. |
| 6,143,620 A | * | 11/2000 | Sharan et al. ................ 438/398 |
| 6,159,849 A | | 12/2000 | Kang et al. |
| 6,165,840 A | | 12/2000 | Choi et al. |
| 6,165,841 A | | 12/2000 | Kim et al. |
| 6,177,696 B1 | * | 1/2001 | Bronner et al. ............. 257/301 |
| 6,211,077 B1 | | 4/2001 | Shimizu et al. |

OTHER PUBLICATIONS

Stanley Wolf, et al., Silicon Processing for the VLSI Era vol. I:Process Technology Lattice Press 1986 pp. 532–534.
R.P.S Thakur, et al., Process Simplification in DRAM Manufacturing, IEEE Transactions on Electron Devices, vol. 45 No. 3, Mar. 1998.
Yamamoto, et al. "Low temperature metal/ON/HSG–cylinder capacitor process for high density embedded DRAMs" IEEE VLSIT Technology, 1999 Digest of Technical pp. 14–16 Jun. 1999, pp. 157–158.

* cited by examiner

*Primary Examiner*—Matthew Smith
*Assistant Examiner*—Igwe U. Anya
(74) *Attorney, Agent, or Firm*—Knobbe, Martens, Olson & Bear, LLP.

(57) ABSTRACT

HSG with an uneven surface is formed by (i) removing a spontaneous oxidation layer formed on an amorphous silicon surface of a semiconductor substrate by preprocessing, (ii) dissociating hydrogen in dangling bonds by heating it to a processing temperature, (iii) forming an amorphous silicon/polysilicon mixed-phase thin film selectively on solely an activated surface of the amorphous silicon surface in a silicon compound atmosphere, and (iv) annealing the film continuously. This method is characterized in including (a) a process which supplies a phosphorus compound and a dilution gas into a reactor while the semiconductor substrate is heated to a processing temperature, and (b) a process of annealing the semiconductor substrate in an atmosphere which contains the phosphorus compound and the dilution gas.

15 Claims, 6 Drawing Sheets

METHOD AND APPARATUS FOR FORMING POLYCRYSTAL SILICON FILM

BACKGROUND OF THE INVENTION

1. Field of the Invention

The present invention relates to manufacturing of a semiconductor device and it particularly relates to a method and an apparatus for forming a polycrystal silicon film on a capacitor electrode surface.

2. Description of the Related Art

As semiconductor devices become more highly integrated in recent years, further reduction in cell size is demanded. Particularly, in the case of dynamic random access memory (DRAM) in which one transistor and one capacitor make up one bit, if cell size is reduced, capacitor electrode size also diminishes, leading to a decline in data storage time. Additionally, if cell size diminishes, the capacity value falls and it becomes difficult to secure the minimum capacity to prevent memory data loss caused by an alpha ray and other factors.

Figure 1A:
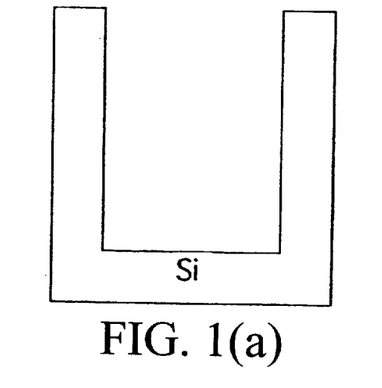
FIGS. 1(a) through 1(e) are schematic cross sections of capacitor electrode structures according to conventional technology.
Figure 1B:
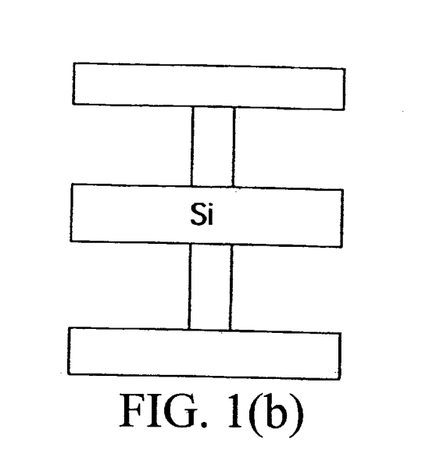
Figure 1C:
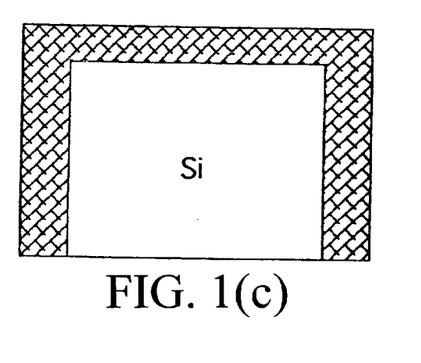
Figure 1D:
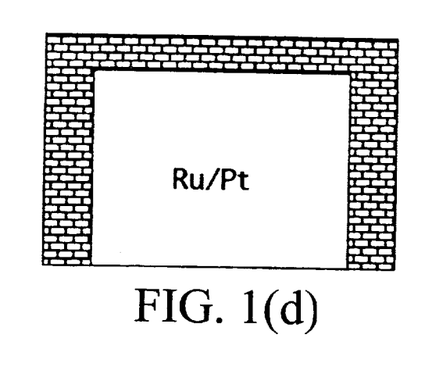

As a method of reducing cell size and at the same time increasing capacitor electrode size, capacitors with a three dimensional structure such as a cylinder structure (FIG. 1(a)) and a fin structure (FIG. 1(b)) were devised and put into practice. These methods, however, have limitations. Additionally, to increase a capacity value, forming a thin film such as tantalum oxide ($Ta_2O_5$) (FIG. 1(c)) with high dielectric constant or barium titanic acid strontium ($Ba_{(x)}Sr_{(1-x)}TiO_2$) (FIG. 1(d)), a ferroelectric film, etc. on a silicon thick film stack surface has been discussed but has not yet been put into practice.

Figure 1E:
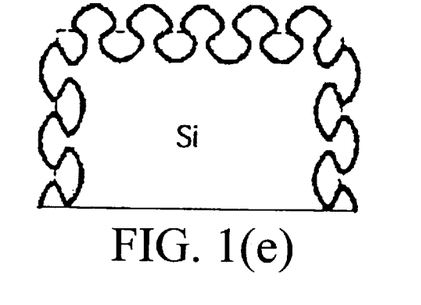

For that reason, the HSG process (hemispherical grained process) which increases a surface area by making Si of capacitor electrode surface uneven attracts attention. This process forms an amorphous silicon/polysilicon mixed-phase thin film selectively only on the active layer of an amorphous silicon surface and anneals the surface at approximately 560° C. (1040° F.). With polysilicon on the surface functioning as a nucleus, amorphous in the mixed-phase active layer then migrates, polycrystal crystallizes and polysilicon grains form. As a result, an uneven-shaped polysilicon film (HSG) is formed on the surface of an amorphous silicon electrode (FIG. 1 (e)).

SUMMARY OF THE INVENTION

When this HSG process is used, however, a problem occurs wherein phosphorus concentration in HSG grain decreases because doped phosphorus atoms (P) migrate poorly as compared with silicon (Si) when the foundation amorphous silicon migrates occurs. As a result, if a C-V measurement is performed, capacity decreases (is depleted) on the negative voltage side. Additionally, a Cmin/Cmax ratio worsens to 0.85~0.40 which was the ratio before HSG formation.

For that reason, a conventional method of supplementing deficient phosphorus by doping $PH_3$ using another device has been used. However, because a semiconductor substrate once contacting the atmosphere needs to be rinsed before $PH_3$ annealing, there were problems such as an increase in the number of processes and a decrease in a surface area due to the etched surface of HSG grain caused by re-rinsing.

Additionally, there was a problem which even if a semiconductor substrate is conveyed to a $PH_3$ reactor without being rinsed, HSG migration progresses in a clean atmosphere and, in a batch method which processes multiple semiconductor substrates collectively, a discrepancy in the degree of migration in semiconductor substrates on the upper portion and lower portion of the boat occurs, and grain size changes.

Consequently, an object of the present invention is to provide a device for forming HSG with which the number of processes does not increase and a surface area does not drop.

Additionally, another object of the present invention is to provide a method of forming HSG with an even grain size at the upper and the lower portions of a boat without causing HSG migration to progress.

Furthermore, another object of the present invention is to provide a method and a device for manufacturing HSG which excels in stability and reproducibility.

To achieve the above-mentioned objects, a method and a device according to the present invention comprise the following processes and devices:

A method according to an embodiment of the present invention is for forming an HSG in a reactor, comprising: (i) removing a spontaneous oxidation layer formed on an amorphous silicon surface of a semiconductor substrate by preprocessing; (ii) dissociating hydrogen atoms from dangling bonds by heating the semiconductor substrate to a processing temperature; (iii) causing an amorphous silicon/polysilicon mixed-phase thin film to grow selectively and solely on an activated surface of the amorphous silicon surface in a silicon compound atmosphere; and (iv) continuously annealing the film to cause migration of the surface to form multiple projections and valleys on the surface. The method further comprises; (v) supplying a coupling compound such as a phosphorus compound (diluted with a dilution gas) to the reactor during a period of heating the semiconductor surface to a processing temperature; and (vi) annealing the semiconductor substrate in the atmosphere containing the coupling compound. In the above, steps (i) and (ii) can be modified or omitted as long as an amorphous silicon/polysilicon mixed-phase thin film is formed on a semiconductor substrate. In other words, in an embodiment, the method can be conducted from step In the above, the silicon compound may include $SiH_4$, $Si_2H_6$, and $SiCl_2H_2$. Further, the coupling compound is a compound capable of end-coupling the activated surface, which may include a phosphorus compound such as $PH_3$. In an embodiment, the coupling compound at a concentration of approximately 0.5% to 2% may be supplied to the reactor at a rate of approximately 50 to 1000 sccm (preferably 100 to 500 sccm) during a heat-up period for annealing. In an embodiment, the final temperature for annealing may reach approximately 200° C. to 750° C. at a rate of approximately 10 to 30° C./min., and during annealing, the pressure of the reactor may be approximately 1 to 10 Torr.

Specifically, in an embodiment, the dilution gas is either an inert gas such as nitrogen, argon, helium, etc. or hydrogen or a mixed gas of more than two kinds.

Further preferably, in an embodiment, a reactor which forms HSG and a reactor which anneals in the phosphorus compound atmosphere are independent, and a process which moves the semiconductor substrate without exposing it to the atmosphere between the two reactors is included.

An apparatus according to the present invention is used for conducting an HSG-forming method, wherein (i) a spontaneous oxidation layer formed on an amorphous silicon surface of a semiconductor substrate is removed by preprocessing; (ii) hydrogen atoms are dissociated from dangling bonds by heating the semiconductor substrate to a processing temperature; (iii) an amorphous silicon/ polysilicon mixed-phase thin film is caused to grow selectively and solely on an activated surface of the amorphous silicon surface in a silicon compound atmosphere; (iv) continuously the film is annealed, thereby causing migration of the surface to form multiple projections and valleys on the surface; and (v) the surface is annealed in an atmosphere which contains a phosphorus compound and a dilution gas, thereby supplementing deficiency of phosphorus atoms.

The apparatus comprises: (a) a first reactor; (b) a first chamber with an elevating device connected to a lower portion of the first reactor; (c) a second reactor; (d) a second chamber with an elevating device connected to a lower portion of the second reactor; and (e) transferring devices connected to the respective chambers to transfer a semiconductor substrate from the first chamber and the second chamber, said transferring devices transferring the semiconductor substrate from the first chamber to the second chamber without exposing the semiconductor substrate to the atmosphere.

Preferably, in an embodiment, a gate valve is provided respectively between the transferring device and the first chamber and between the transferring device and the second chamber.

For purposes of summarizing the invention and the advantages achieved over the prior art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of the present invention will become apparent from the detailed description of the preferred embodiments which follow.

BRIEF DESCRIPTION OF THE DRAWINGS

These and other features of the present invention will now be described with reference to the drawings of preferred embodiments which are intended to illustrate and not to limit the invention.

In the drawings, numeral 1 is a wafer transfer module (TM), 2 is a $PH_3$ reactor, 3 is a surface reaction thin-film formation device (S.R.D. reactor), 4 is a cassette module, 5 is a turbo molecular pump, 6 is a gate valve, 7 is a semiconductor wafer, 8 is an exhaust port, 9, 9' are bellows, 10, 10' are ball screws, 11 is a boat, 12 is a boat elevator chamber (BEC), 13 is a heater, 14 is a gas inlet port, 15 is a semiconductor wafer conveyance level, 16 is a sealing surface, 18 is an exhaust port, 19 is an axis, 20, 20' are power converters.

DETAILED DESCRIPTION OF THE PREFERRED EMBODIMENT

The present invention is explained referring to the figures in the following:

An apparatus according to an embodiment of the present invention, which is used in an HSG-forming method, which supplements deficiency of phosphorus atoms by annealing in an atmosphere which contains a phosphorus compound and a dilution gas. The method comprises: removing a spontaneous oxidation layer formed on an amorphous silicon surface of a semiconductor substrate by preprocessing; causing the surface to migrate unevenly by dissociating hydrogen atoms from dangling bonds by heating the semiconductor substrate to a processing temperature; forming an amorphous silicon/polysilicon mixed-phase thin film selectively solely on an activated surface of the amorphous silicon surface in the silicon compound atmosphere; and annealing it continuously. The apparatus comprises: a surface reaction thin-film-forming reactor (S.R.D. reactor) 3; a first boat elevator chamber (BEC) 12 with an elevating device which is connected to a lower portion of the S.R.D. reactor 3; a $PH_3$ annealing device ($PH_3$ reactor) installed on the opposite side of the S.R.D. reactor 3; a second BEC (basically the same structures as the first BEC) with an elevating device which is connected to a lower portion of the $PH_3$ reactor 2; and a wafer transfer module (TM) 1 connected to the first and second BECs to transfer a semiconductor substrate 7 from the first BEC 12 to the second BEC one by one. The TM 1 has a characteristic of transferring the semiconductor substrate 7 from the first BEC 12 to the second BEC without exposing it to the atmosphere.

Figure 2:
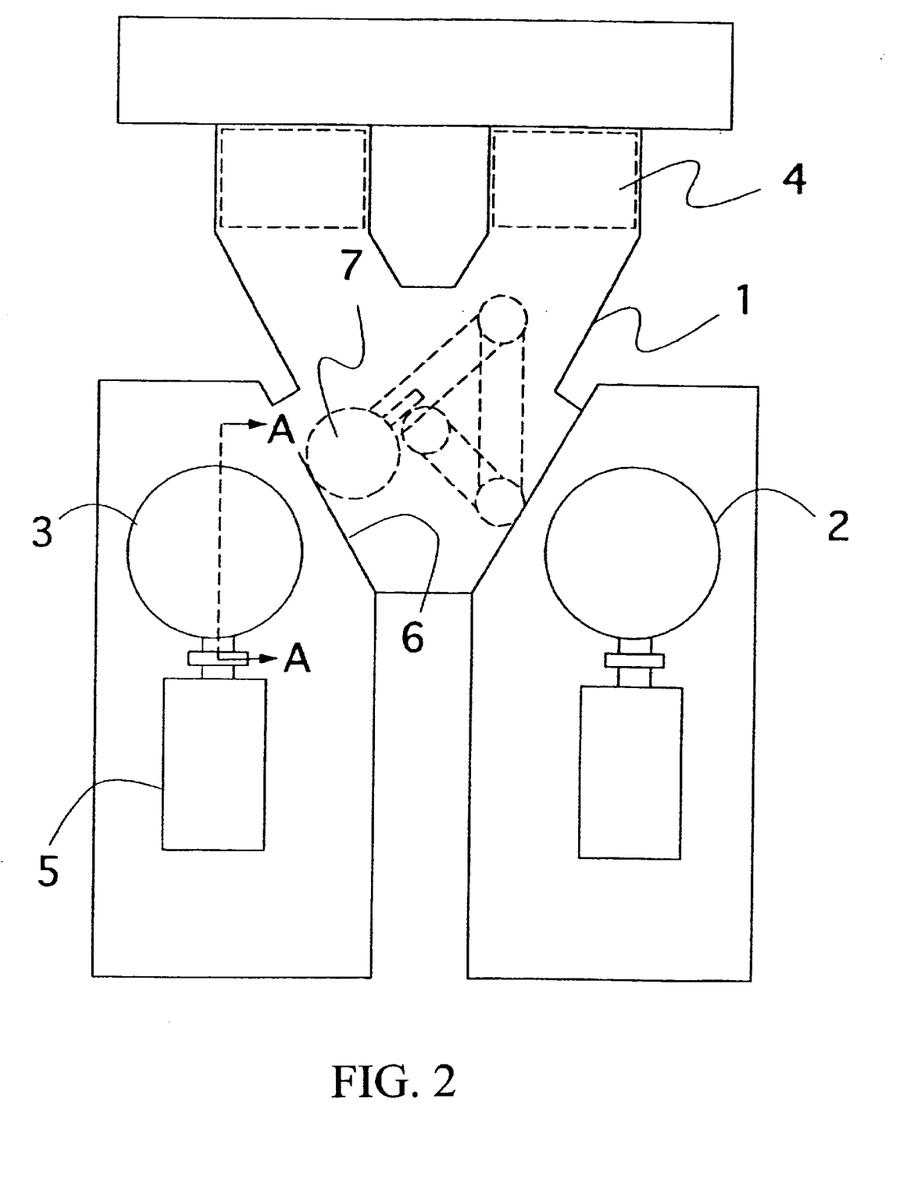
FIG. 2 is a plane figure of a semiconductor-manufacturing device according to the present invention.
Figure 3A:
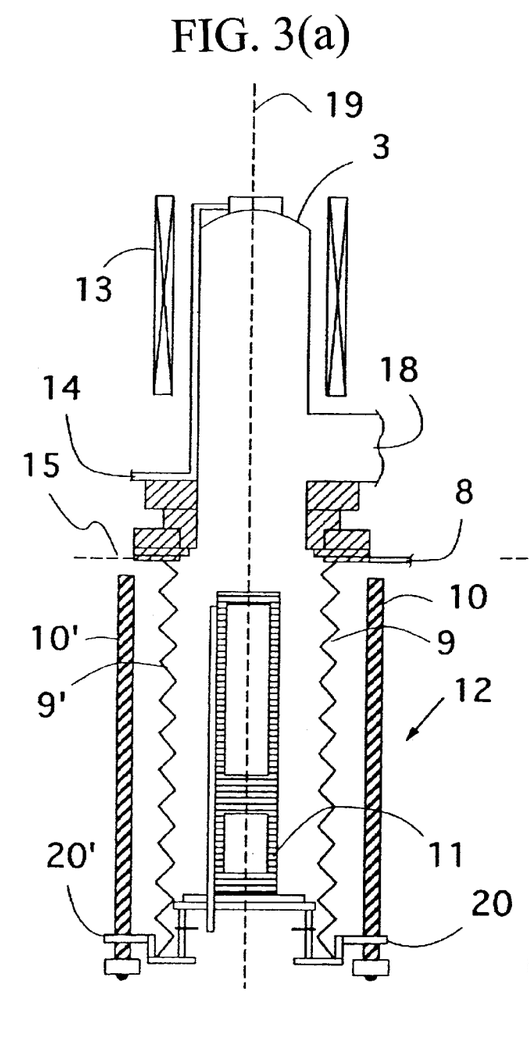
FIGS. 3(a) and 3(b) are A—A end views of FIG. 2.
Figure 3B:
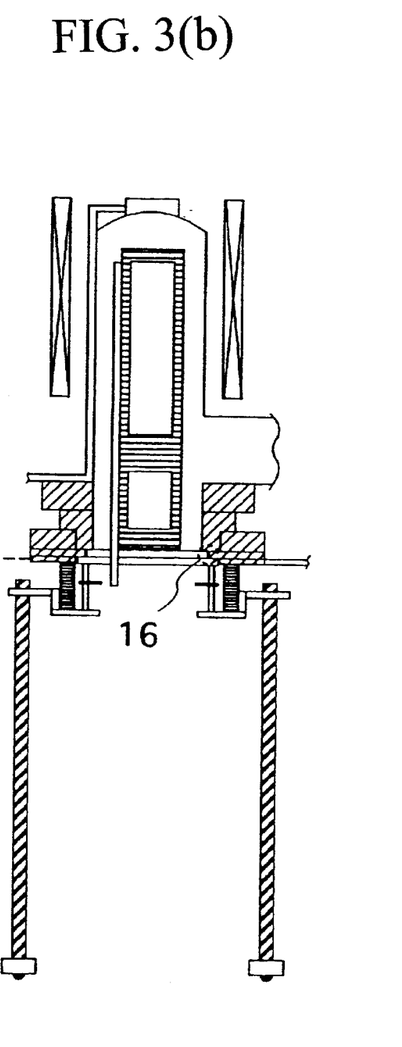

FIG. 2 is a plane figure of a device according to an embodiment of the present invention. FIGS. 3(a) and 3(b) schematically illustrate an A—A end view of FIG. 2. The device according to an embodiment of the present invention has the S.R.D. reactor 3 comprising nearly cylindrical quartz, a gas inlet port 14 to bring in a reaction gas to the S.R.D. reactor and an exhaust port 18 to exhaust a reaction gas in a reactor. The exhaust port 18 is combined with an external turbo molecular pump 5 and maintains the inside of the reactor at a designated pressure.

FIG. 3(a) is an end view of the device before the processing. The BEC 12 is provided at the lower portion of the S.R.D. reactor 3, and is combined with the upper S.R.D. reactor coaxially and airtightly. The BEC 12 supports the nearly cylindrical boat 11, on which a semiconductor wafer is loaded, along an axis 19. The BEC 12 also has an exhaust port 8 combined with a dry pump (not shown). Additionally, the BEC 12 has an elevating mechanism comprising ball screws (10, 10') and a converter (20, 20') which converts the turning moment of the ball screws to the vertical propelling power. Preferably, these ball screws (10, 10') are combined with an electric motor and the boat 11 enters into the inside of the S.R.D. reactor as the ball screws (10, 10') turn. On the inside of these ball screws, bellows (9, 9') are provided symmetrically with the axis 19. The bellows (9, 9') are capable of expansion and contraction vertically and insulate the boat 11 from the atmosphere.

FIG. 3(b) is an end view of the device during the processing. When the boat 11 is completely loaded inside the S.R.D. reactor 3 by the elevating mechanism, the S.R.D. reactor 3 and the BEC 12 are sealed with the seal surface 16. At the level 15 of the BEC 12, the BEC 12 and TM 1 are connected. A gate valve 6 is provided at the connection surface and is opened only when a wafer 7 is carried in and out of the boat 11. The inside of TM 1 is maintained at 0.5~1.5 Torr and the semiconductor wafer 7 is transferred from the first BEC 12 to the second BEC within the TM 1 under low pressure and without being exposed to the atmosphere.

A $PH_3$ annealing treatment device (a $PH_3$ reactor) 2 and the second BEC (basically the same structures as the first BEC) are provided on the opposite side of the S.R.D. reactor completely symmetrically with the S.R.D. reactor 3 and the BEC 12.

A method according to an embodiment of the present invention forms HSG with an uneven surface by removing a spontaneous oxidation layer formed on an amorphous silicon surface of a semiconductor substrate by preprocessing; dissociating hydrogen atoms from dangling bonds by heating it to a processing temperature; forming an amorphous silicon/polysilicon mixed-phase thin film selectively solely on an activated surface of the amorphous silicon surface in a silicon compound atmosphere; and annealing it continuously. The method is characterized in further including (i) a process which supplies a phosphorus compound and a dilution gas into a reactor while the semiconductor substrate is heated to a processing temperature, and (ii) a process of annealing the semiconductor substrate in an atmosphere which contains the phosphorus compound and the dilution gas.

Referring to FIGS. 4(*a*) through 4(*g*), as shown in FIG. 4(*a*), a capacitor electrode comprises an interlayer film (SiO$_2$) 33 which is evenly formed on the semiconductor substrate (Si) 34, an amorphous silicon film 31 which is formed on the interlayer film 33 and polysilicon 32 which connects the amorphous silicon film 31 and the semiconductor substrate 34. A spontaneous oxidation layer also clings to the capacitor electrode (FIG. 4(*a*)).

Figure 4A:
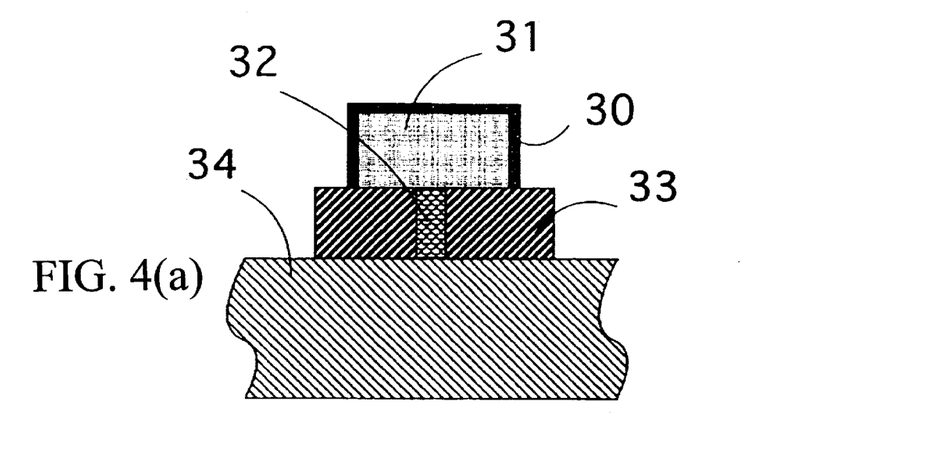
FIGS. 4(a) through 4(g) are schematic cross sections of capacitor electrode structures in each process to form HSG according to the present invention.
Figure 4B:
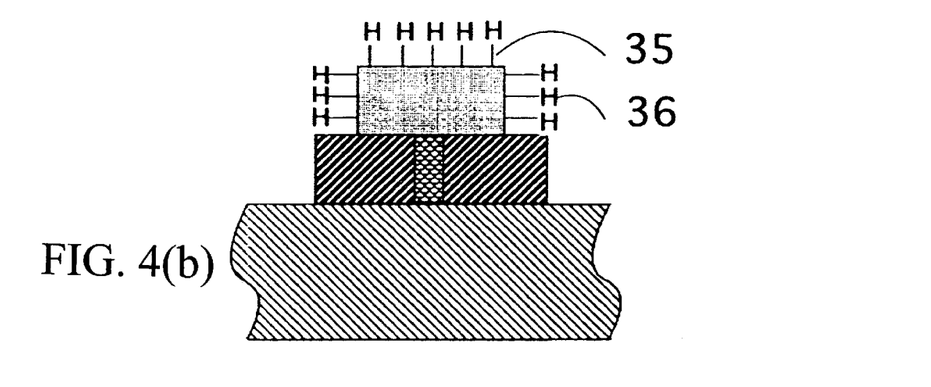

As preprocessing, a semiconductor wafer is soaked in diluted HF for the stated time, a spontaneous oxidation layer is removed, and the wafer is rinsed and dried. Subsequently, a semiconductor wafer is cast into a cassette module 4, the cassette module is evacuated by a dry pump and pressure is controlled at 1 Torr while nitrogen is poured. At this time, hydrogen atoms 36 are bonded with dangling bonds 35 on the surface of amorphous silicon 31 (FIG. 4(*b*)).

Figure 4C:
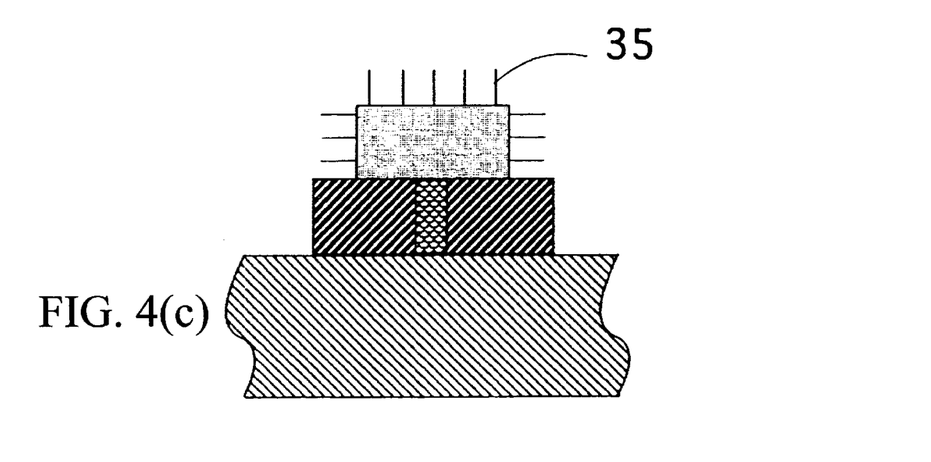
Figure 4D:
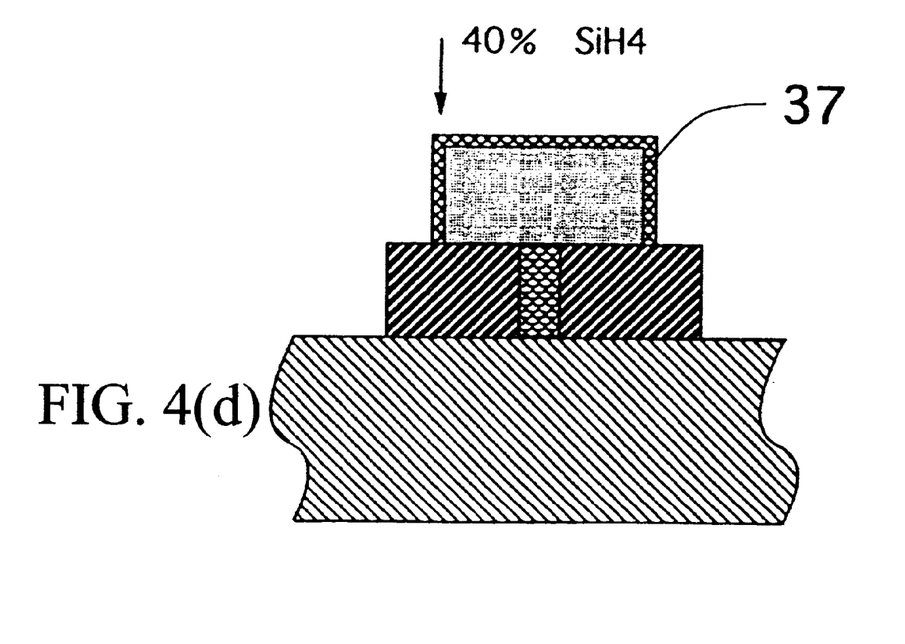

Semiconductor wafers 7 within the cassette module 4 which is controlled at 1 Torr are conveyed one by one to a boat 11 of the BEC 12 connected to the lower portion of the S.R.D. reactor 3 through the TM 1 which is also controlled at 1 Torr. At this time, the boat 11 is inside the BEC 12 and is designed to rise by one step via the elevating mechanism each time a semiconductor wafer is conveyed. After all semiconductor wafers 7 within the cassette module 4 are conveyed to the boat 11, the TM 1 and the BEC 12 are detached. The BEC 12 loads the boat 11 with multiple semiconductor wafers to the S.R.D. reactor 3. At this time, a pressure of the S.R.D. reactor is set to 1E- 5~1E-1 Torr by a turbo molecular pump 5. Loaded multiple semiconductor wafers are then heated to approximately 560° C. (1040° F.) during the stated time by the heater 13. Hydrogen atoms 36 bonded with the dangling bond 35 separate and the dangling bonds become naked (exposed) (FIG. 4(*c*)).

After heating is completed, SiH$_4$ gas which is diluted to 30~50% is brought in from a gas inlet port 14 into the S.R.D. reactor and amorphous silicon/polysilicon mixed-phase thin film 37 which is selectively active only on amorphous silicon 31 is formed (FIG. 4(*d*)).

Figure 4E:
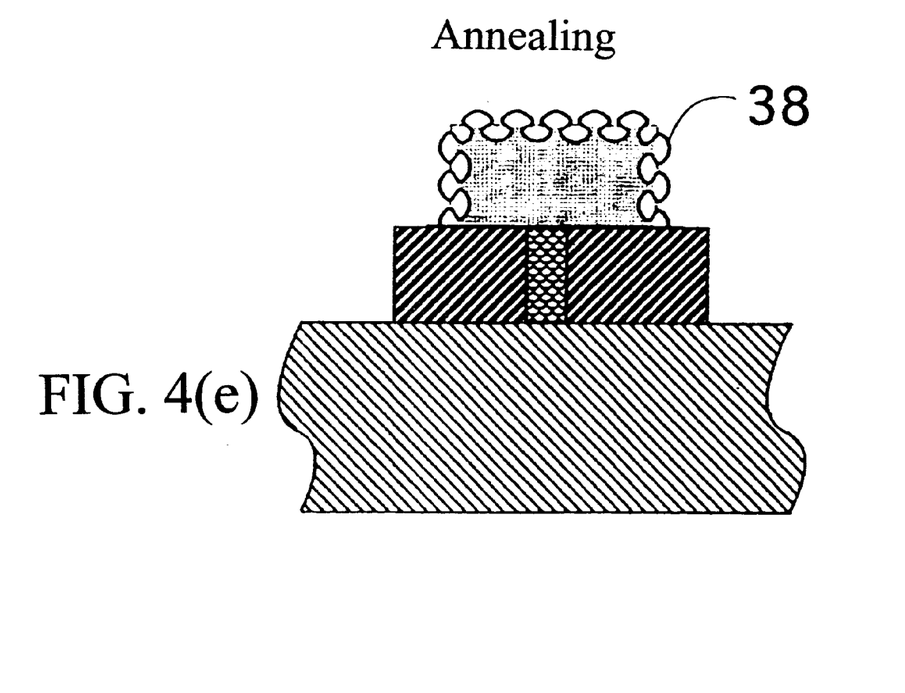

The gas is then turned off, and by evacuating the pressure within the S.R.D. reactor to the base pressure (1E- 9~1E-7 Torr), annealing treatment is performed continuously. Migration of compounds on the surface is then caused and HSG 38 is formed on the amorphous silicon surface (FIG. 4(*e*)). At this time, by controlling the growth of mixed-phase film thickness of amorphous silicon, HSG density can be controlled. By adjusting the annealing time, HSG grain size can also be adjusted to obtain a grain size with any given HSG density.

The boat 11 is then unloaded (i.e., by lowering the boat 11 one step at a time via the elevating mechanism), and processed semiconductor wafers are conveyed one at a time to the second boat within the second BEC through the TM 1, the pressure of which is controlled at 1 Torr. When all semiconductor wafers are conveyed, the TM 1 and the second BEC are detached. It should be noted here that semiconductor wafers are never exposed to the atmosphere when they are conveyed from the first reactor to the second reactor. Consequently, concerns about particle contamination and formation of a spontaneous oxidation layer have been eliminated and a rinsing process can be omitted.

Figure 4F:
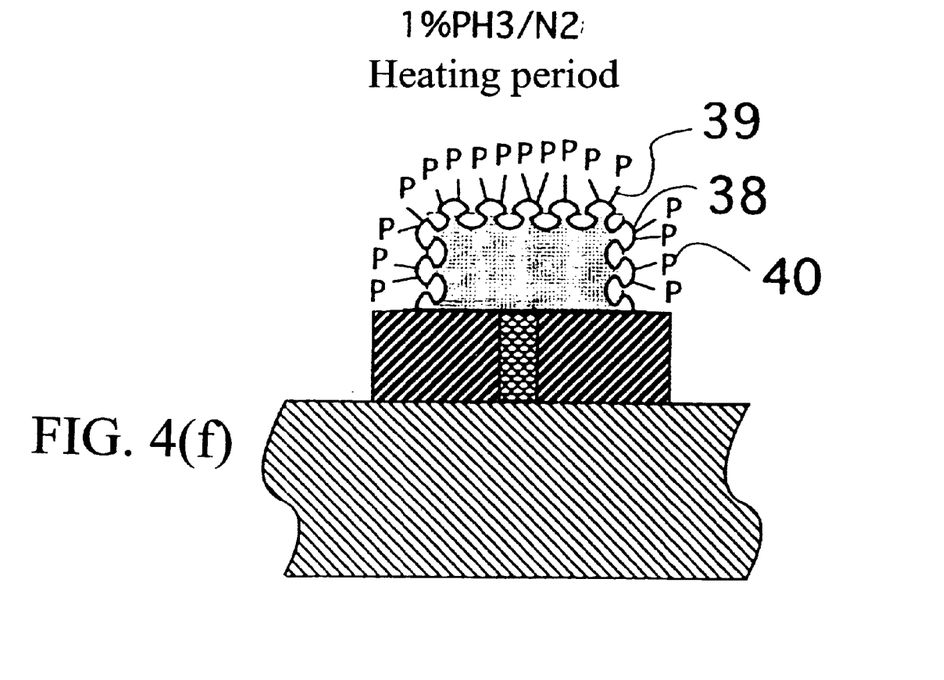
Figure 4G:
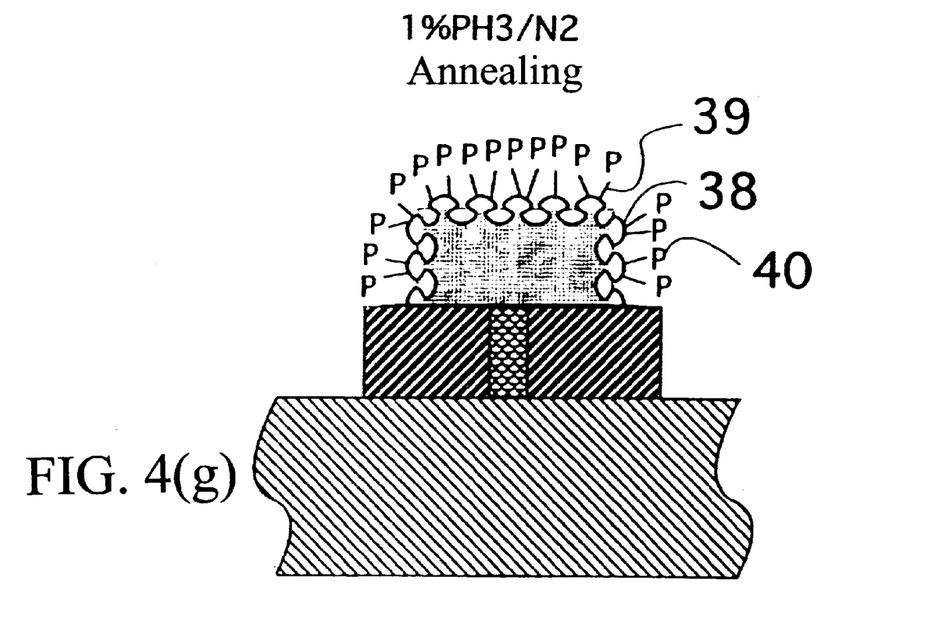

The second BEC loads a boat with multiple semiconductor wafers to a PH$_3$ reactor 2 via the elevating mechanism. Immediately after loading, PH$_3$ gas and diluted gas are supplied into the PH$_3$ reactor. As diluted gas, either of an inert gas such as nitrogen, argon, helium, etc. or hydrogen or a mixed gas of more than two kinds can be used. With PH$_3$ gas and diluted gas being poured into the PH$_3$ reactor, loaded multiple semiconductor wafers are heated to a designated temperature. Migration progress of the semiconductor wafers is then controlled and phosphorus atoms P bond with the dangling bond 39 of HSG 38 (FIG. 4(*f*)).

After the designated temperature is attained, PH$_3$ annealing is performed for the stated time (FIG. 4(*g*)).

A point to be noted here is that, before starting PH$_3$ annealing, by supplying PH$_3$ gas into the reactor during the heating period during which a temperature of a semiconductor wafer rises to processing temperature, surface migration after HSG formation can be controlled and unevenness of the grain size caused by the position of the semiconductor wafer inside the boat can be improved.

To stop migration occurring on a semiconductor wafer after HSG formation, it is necessary to crystallize an activated surface of the HSG surface by end-coupling the activated surface with a stable material or by cooling it sufficiently. However, because end-coupling the surface by introducing oxygen, etc., reduces the surface area and cooling a semiconductor wafer takes a long time and decreases productivity, neither method can be used. For this reason, PH$_3$ gas which decomposes at a relatively low temperature is introduced during a heat-up period, and it has been found that it is effective in end-coupling the activated surface of the HSG surface and controlling migration.

EXAMPLE

The rate of capacity increase was measured under the following conditions:
(1) Preprocessing:

After removing a spontaneous oxidation layer adhered to an amorphous silicon surface of a semiconductor wafer 7 by soaking in diluted HF of 0.3% and rinsing this semiconductor wafer with pure water, it was dried and cast into a cassette module. The cassette module was evacuated by a dry pump. The pressure then was controlled at 1 Torr while nitrogen was poured.
(2) HSG formation:

Through a TM 1 which was controlled at 1 Torr by a dry pump, semiconductor wafers 7 with preprocessing completed were conveyed one at a time from the cassette module 4 to the boat 11 of the first BEC 12. Each time a semiconductor wafer was conveyed, the boat 11 rose via an elevating mechanism (10, 20, 10', 20'), a gate valve 6 was closed after all semiconductor wafers 7 were conveyed, and the BEC 12 loaded the boat 11 inside the S.R.D. reactor 3. After the boat 11 was loaded, the S.R.D. reactor 3 was evacuated by a turbo molecular pump and internal pressure was controlled at 1E-3 Torr while 100 sccm of He gas was poured. The inside of the S.R.D. reactor then was heated to 560° C. (1040° F.) for 20 minutes by a heater 13. 60 sccm of SiH4 diluted to 40% then was introduced. Under conditions wherein the inside of the S.R.D. reactor 3 is evacuated to the base pressure (1E-8 Torr) by the turbo molecular pump, annealing was performed continuously.

(3) $PH_3$ annealing:

After annealing was completed, the BEC 12 unloaded the boat 11. Semiconductor wafers were taken out one at a time from the boat 11 and carried out of the S.R.D. reactor 3. The pressure inside the S.R.D. reactor 3 at this time was approximately 1 Torr. The boat 11 descended via the elevating mechanism every time a semiconductor wafer was carried out. After all of the semiconductor wafers were carried out, the gate valve 6 was closed again.

Semiconductor wafers 7 carried out of the S.R.D. reactor 3 were loaded into a boat inside the second BEC through the TM 1 controlled at 1 Torr. After carrying in of all semiconductor wafers was completed, a gate valve was closed. The second BEC loaded the boat into a $PH_3$ reactor via an elevating mechanism. Immediately after being loaded, the wafers were heated to 650° C. (1202° F.) for 30 minutes while 500 sccm of $PH_3$ gas was introduced. $PH_3$ annealing was performed continuously for one hour.

Table 1 shows the result of the experiment with the above-mentioned conditions.

TABLE 1

| Conditions | Position of a Wafer within the Boat | Capacity Increase Rate | | | Comments |
|---|---|---|---|---|---|
| | | −1.4 V | 0 V | +1.4 V | |
| a. (Thick film stack) | Center | 1 | 1 | 1 | Initial values |
| b. (+HSG) | Center | 1.8 | 2.4 | 2.4 | |
| c. (+HSG+$PH_3$) | Upper portion | 1.2 | 1.2 | 1.2 | Without $PH_3$ flow during heat-up period |
| | Center | 1.5 | 1.5 | 1.5 | |
| | Lower portion | 1.9 | 1.9 | 1.9 | |
| d. (+HSG+$PH_3$) | Upper portion | 2.5 | 2.5 | 2.5 | With $PH_3$ flow during heat-up period |
| | Center | 2.5 | 2.5 | 2.5 | |
| | Lower portion | 2.5 | 2.5 | 2.5 | |

Sample d in which HSG was formed according to an embodiment of the present invention was not deficient in phosphorus present in grains and an approximately 2.5 times larger capacity increase (surface area) was obtained as compared with Sample a in which HSG was not formed. Additionally, for Sample b without annealing, the rate of capacity increase decreased at 1.4V under the influence of depletion. The result also indicates that migration progressed and the surface area decreased for Sample c without $PH_3$ flowing during a heat-up period in the $PH_3$ annealing reactor.

THE EFFICACY OF THE PRESENT INVENTION

In an embodiment, the present invention eliminates concerns about semiconductor wafers being exposed to the atmosphere during all the processes and about particle contamination and forming of a spontaneous oxidation layer. Additionally, because the rinsing process is not required, by reducing the number of processes, productivity was successfully improved.

According to an embodiment of the present invention, the progress of migration could also be moderately controlled and HSG grains with a larger surface area can be formed. HSG grains with an even surface area at an upper portion and a lower portion of the boat can be successfully formed.

Furthermore, according to the present invention, a manufacturing method and an apparatus which excel in stability and reproducibility can be provided.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method for forming an HSG on a semiconductor substrate, comprising:
   (i) forming an amorphous silicon/polysilicon mixed-phase thin film selectively and solely on an activated surface of an amorphous silicon surface of the semiconductor substrate in a silicon compound atmosphere in a reactor; and
   (ii) continuously annealing the film in a reactor to cause migration of the surface to form multiple projections and valleys on the surface, wherein a compound capable of end-coupling the active surface is supplied to the reactor during a heat-up period prior to reaching a temperature for the annealing; thereby forming an HSG.

2. The method as claimed in claim 1, wherein the reactor for film formation is also the reactor for annealing.

3. The method as claimed in claim 1, wherein the compound is a phosphorus compound.

4. The method as claimed in claim 3, wherein the phosphorus compound is $PH_3$.

5. The method as claimed in claim 1, wherein the compound is supplied at a rate of 50 to 1000 sccm.

6. The method as claimed in claim 1, wherein the annealing is conducted at a temperature of 500° C. to 750° C. under a pressure of 1 to 10 Torr.

7. The method as claimed in claim 1, wherein the heat-up is conducted at 10 to 30° C./min.

8. A method for forming an HSG on a semiconductor substrate in a reactor, comprising: (i) removing a spontaneous oxidation layer formed on an amorphous silicon surface of a semiconductor substrate by preprocessing; (ii) dissociating hydrogen atoms from dangling bonds by heating the semiconductor substrate to a processing temperature; (iii) causing an amorphous silicon/polysilicon mixed-phase thin film to grow selectively and solely on an activated surface of the amorphous silicon surface in a silicon compound atmosphere; and (iv) continuously annealing the film to cause migration of the surface to form multiple projections and valleys on the surface,
   said method further comprising: (v) supplying a phosphorus compound and a dilution gas to the reactor during a period of heating the semiconductor surface to a processing temperature; and (vi) annealing the semiconductor substrate in an atmosphere containing the phosphorus compound and the dilution gas.

9. The method as claimed in claim 8, wherein said silicon compound is $SiH_4$.

10. The method as claimed in claim 8, wherein said phosphorus compound is $PH_3$.

11. The method as claimed in claim 8, wherein said dilution gas is selected from the group consisting of an inert gas, hydrogen, and a mixed gas thereof.

12. The method as claimed in claim 11, wherein the inert gas is nitrogen, argon, or helium.

13. The method as claimed in claim 8, which is conducted in a reactor to form the HSG and in another reactor to anneal in the phosphorus compound atmosphere, wherein the semiconductor substrate is transferred between the two reactors without exposing the substrate to the atmosphere.

14. An apparatus for conducting an HSG-forming method comprising (i) removing a spontaneous oxidation layer formed on an amorphous silicon surface of a semiconductor substrate by preprocessing; (ii) dissociating hydrogen atoms from dangling bonds by heating the semiconductor substrate to a processing temperature; (iii) causing an amorphous silicon/polysilicon mixed-phase thin film to grow selectively and solely on an activated surface of the amorphous silicon surface in a silicon compound atmosphere; (iv) continuously annealing the film, thereby causing migration of the surface to form multiple projections and valleys on the surface; and (v) annealing the surface in an atmosphere which contains a phosphorus compound and a dilution gas, thereby supplementing deficiency of phosphorus atoms, said apparatus comprises: (a) a first reactor; (b) a first chamber with an elevating device connected to a lower portion of the first reactor; (c) a second reactor; (d) a second chamber with an elevating device connected to a lower portion of the second reactor; and (e) transferring devices connected to the respective chambers to transfer a semiconductor substrate from the first chamber and the second chamber, said transferring devices transferring the semiconductor substrate from the first chamber to the second chamber without exposing the semiconductor substrate to the atmosphere.

15. The apparatus as claimed in claim 14, wherein a gate valve is provided between the transferring device and the first chamber and between the transferring device and the second chamber, respectively.

* * * * *